(12) United States Patent
Heo et al.

(10) Patent No.: US 12,307,328 B2
(45) Date of Patent: May 20, 2025

(54) METHOD FOR LOGICAL CNOT OPERATION OF QUANTUM LOGICAL QUBITS

(71) Applicant: Korea University Research and Business Foundation, Seoul (KR)

(72) Inventors: Jun Heo, Seoul (KR); Jonghyun Lee, Seoul (KR); Yujin Kang, Seoul (KR); Jinyoung Ha, Seoul (KR)

(73) Assignee: Korea University Research and Business Foundation, Seoul (KR)

( * ) Notice: Subject to any disclaimer, the term of this patent is extended or adjusted under 35 U.S.C. 154(b) by 290 days.

(21) Appl. No.: 17/982,127

(22) Filed: Nov. 7, 2022

(65) Prior Publication Data
US 2023/0419142 A1 Dec. 28, 2023

(30) Foreign Application Priority Data

Jun. 22, 2022 (KR) .................. 10-2022-0075912
Sep. 8, 2022 (KR) .................. 10-2022-0113870

(51) Int. Cl.
| | | |
|---|---|---|
| G06N 10/20 | (2022.01) | |
| B82Y 10/00 | (2011.01) | |
| G06N 10/00 | (2022.01) | |
| G06N 10/60 | (2022.01) | |
| G06N 10/70 | (2022.01) | |
| H03K 19/195 | (2006.01) | |

(52) U.S. Cl.
CPC .............. *G06N 10/20* (2022.01); *B82Y 10/00* (2013.01); *G06N 10/00* (2019.01); *G06N 10/60* (2022.01); *G06N 10/70* (2022.01); *H03K 19/195* (2013.01)

(58) Field of Classification Search
CPC ........ G06N 10/20; G06N 10/70; G06N 10/00; G06N 10/60; H03K 19/195; B82Y 10/00
USPC ................... 326/3, 6, 7; 438/2, 962; 257/31; 505/190; 977/933
See application file for complete search history.

(56) References Cited

U.S. PATENT DOCUMENTS

2021/0374588 A1    12/2021   Gidney et al.

FOREIGN PATENT DOCUMENTS

| KR | 10-2019-0070243 A | 6/2019 |
|---|---|---|
| KR | 10-2361858 B1 | 2/2022 |

OTHER PUBLICATIONS

Rosenblum et al (NPL Nature Communications (DOI: 10.1038/s41467-018-03059-5): A CNOT gate between multiphoton qubits encoded in two cavities. (Year: 2018).*

* cited by examiner

*Primary Examiner* — Arnold M Kinkead
(74) *Attorney, Agent, or Firm* — NSIP Law

(57) ABSTRACT

Disclosed is a method for a logical CNOT operation of quantum logical qubits, which is performed by a quantum computing device, which may include: arranging a plurality of logical data qubits in a first column which is a horizontal column; arranging a plurality of logical ancilla qubits corresponding to the plurality of logical data qubits, respectively as a second column which is a horizontal column different from the first column to correspond to the plurality of logical data qubits, respectively; and performing logical controlled NOT (CNOT) for a first logical data qubit and a second logical data qubit among the plurality of logical data qubits.

9 Claims, 12 Drawing Sheets

(a)

(b)

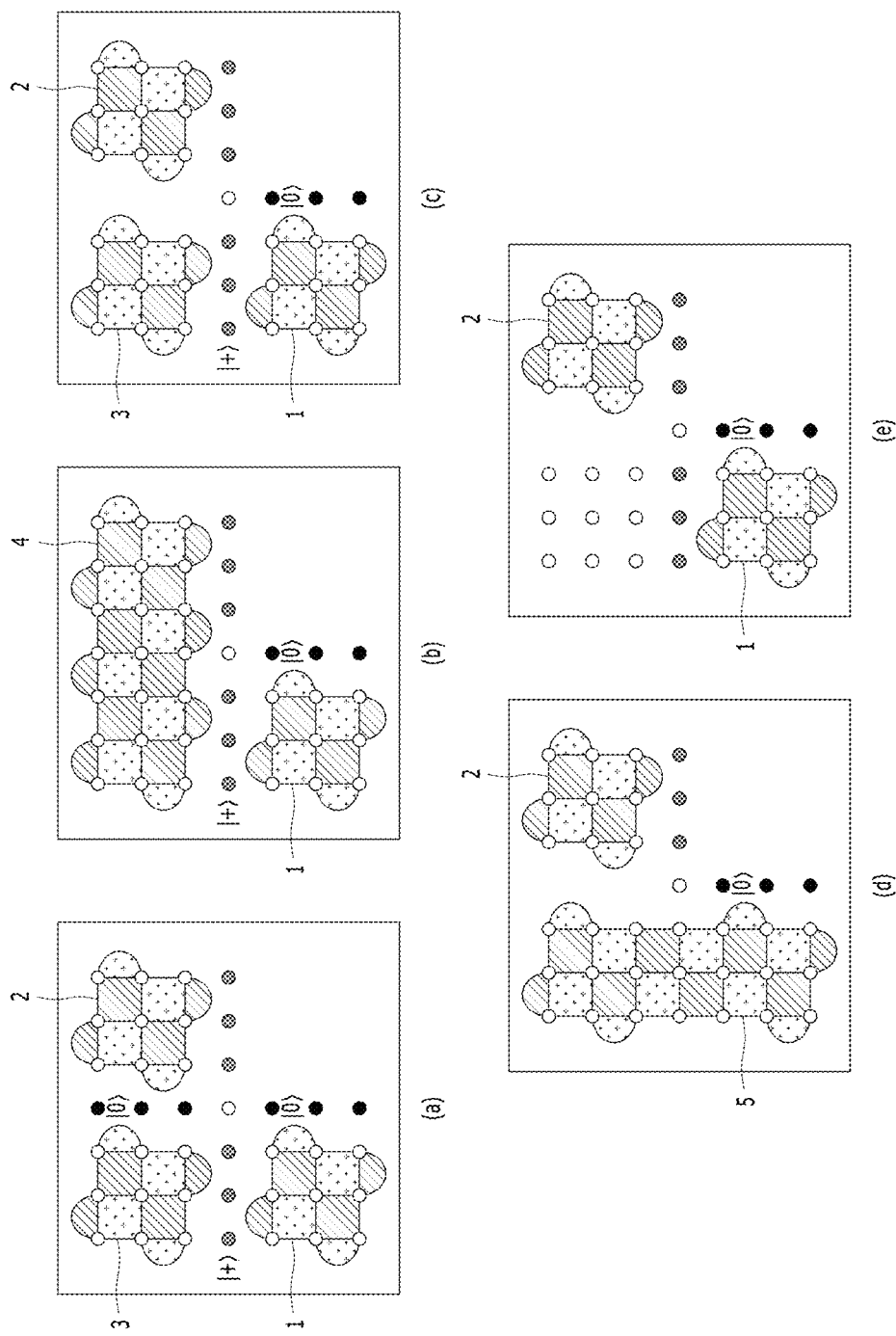
[FIG. 1]

[FIG. 2]
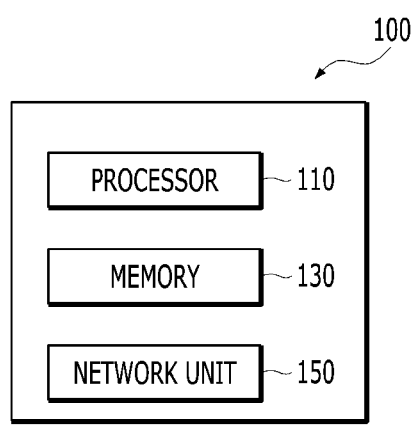

[FIG. 3]
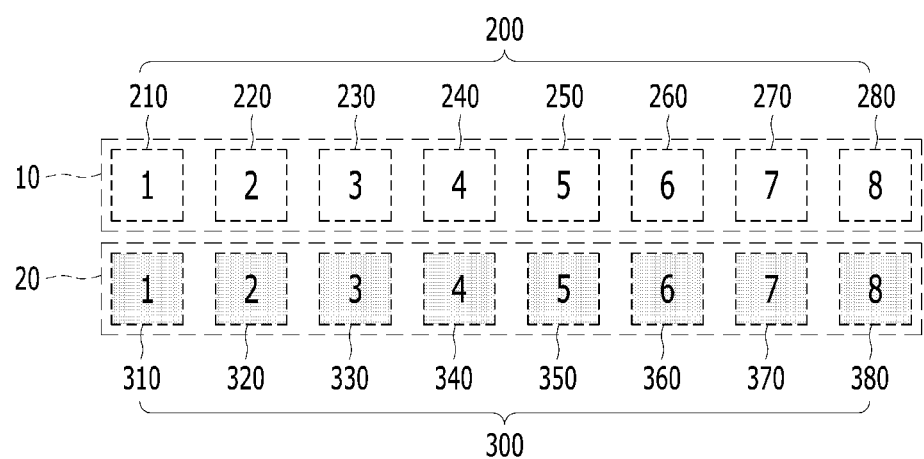

[FIG. 4]
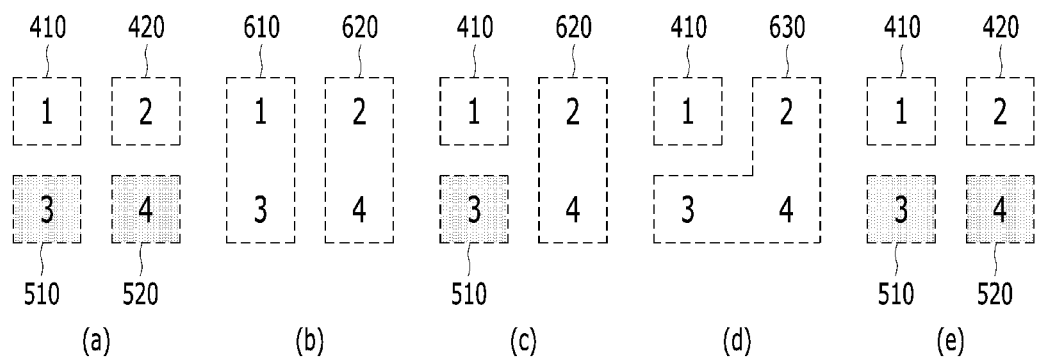

[FIG. 5]
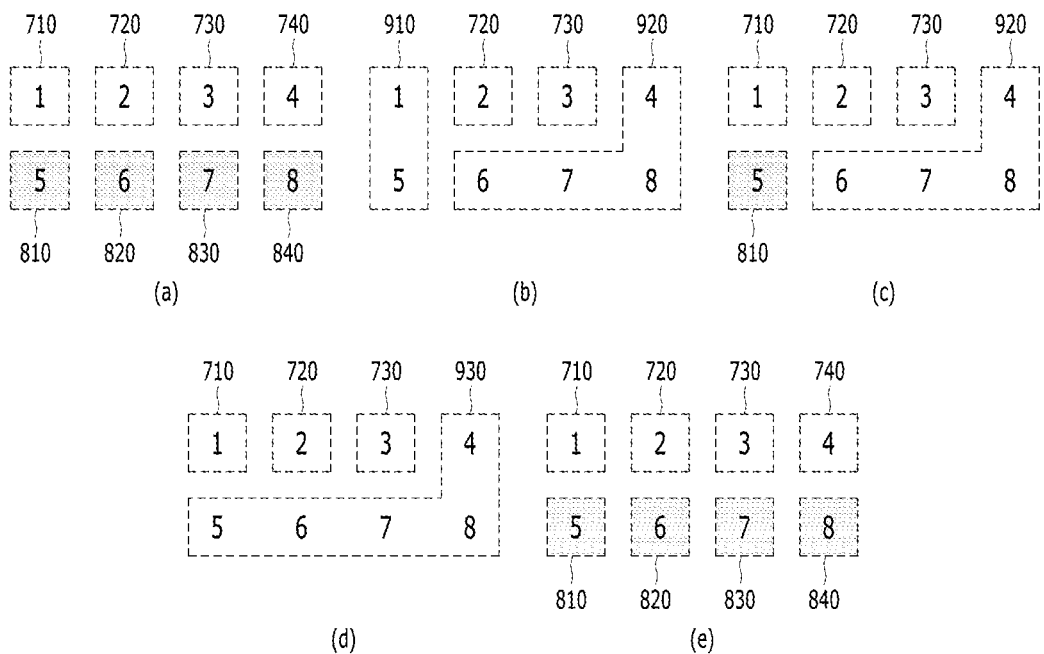

[FIG. 6]
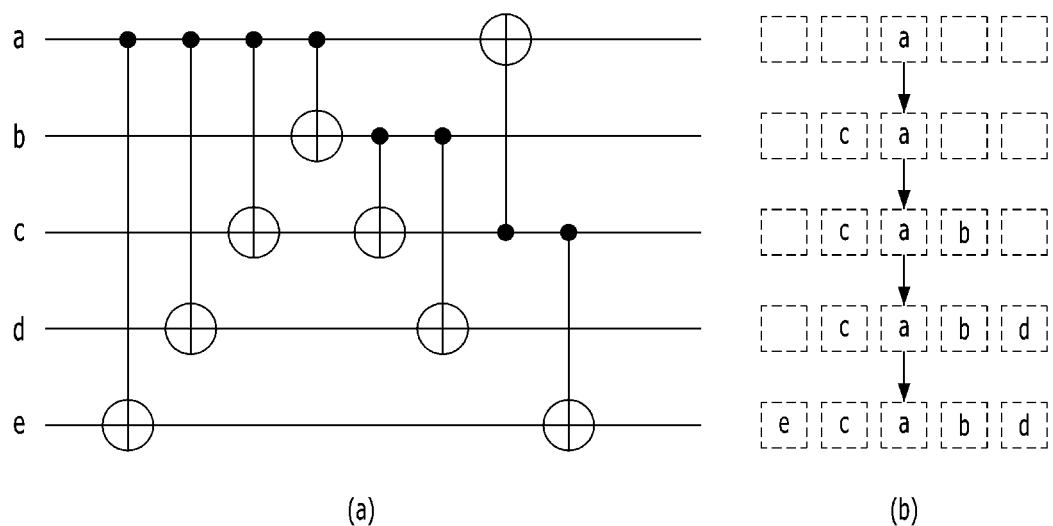
(a)                    (b)

[FIG. 7]
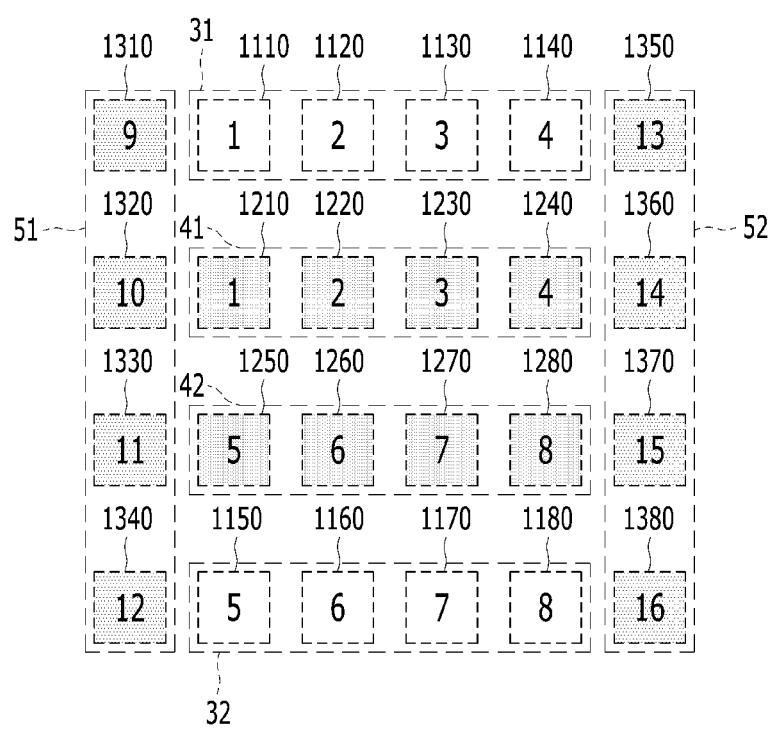

[FIG. 8]
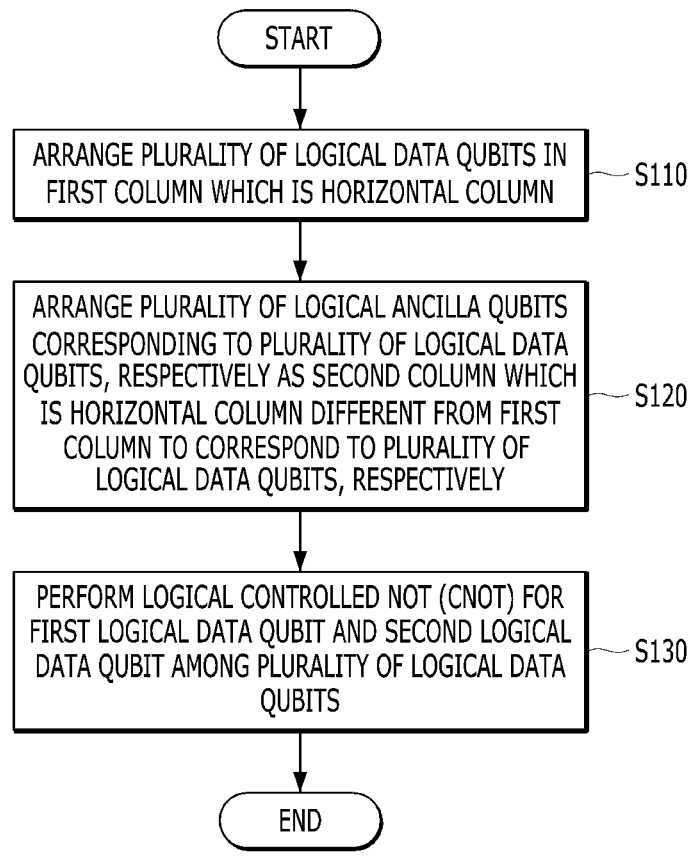

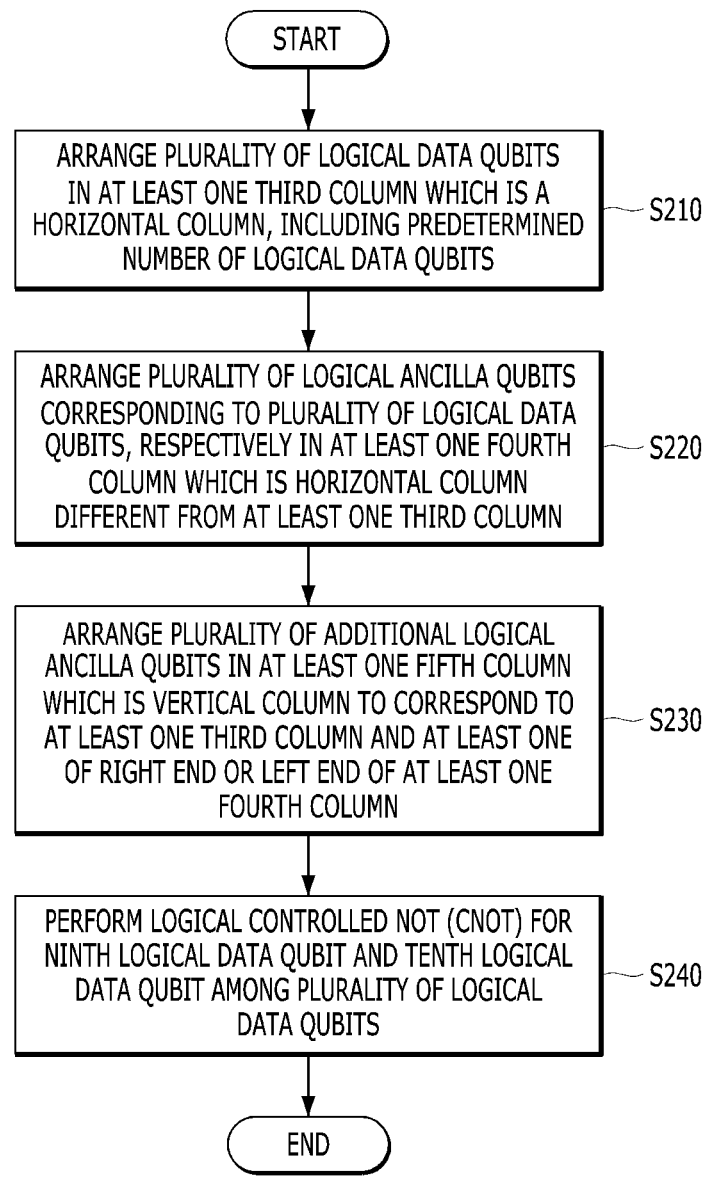

[FIG. 10]
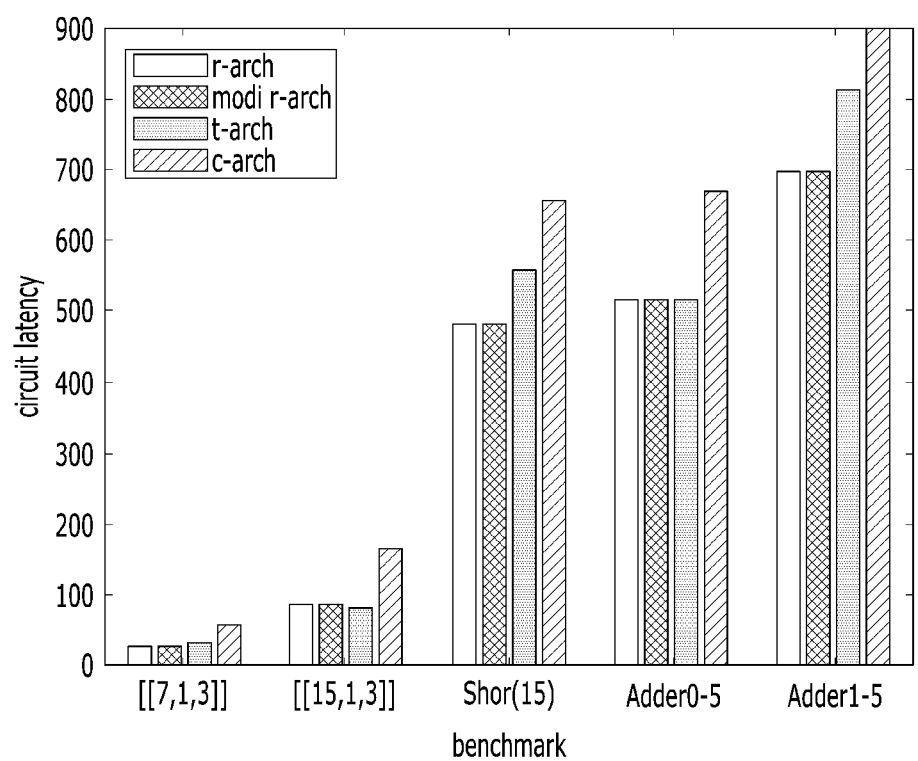

[FIG. 11]
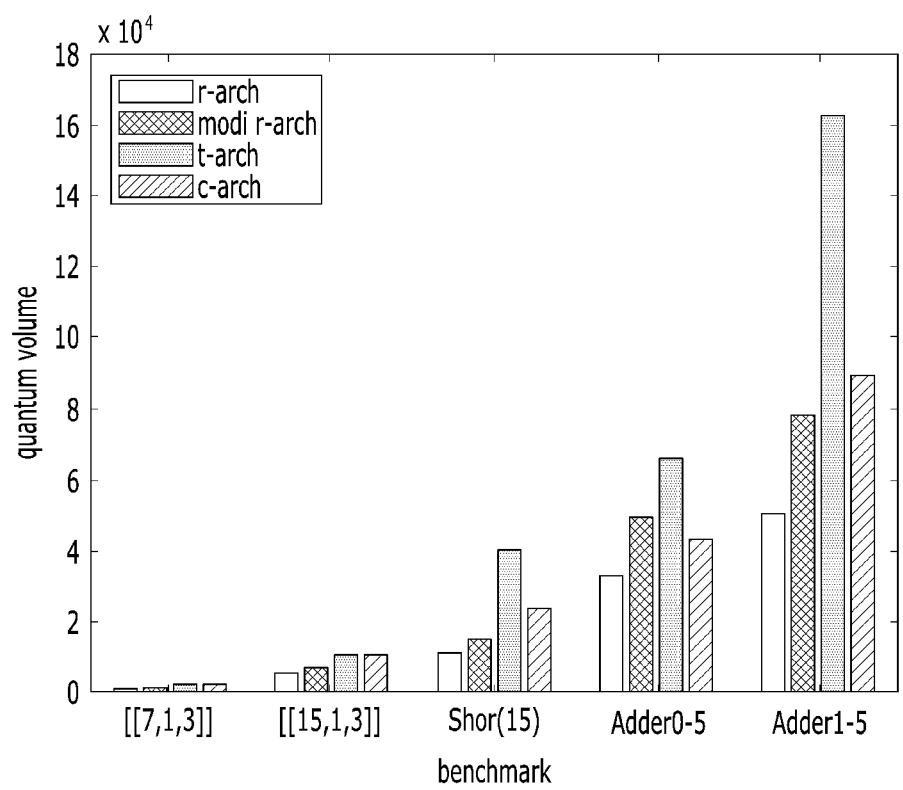

[FIG. 12]
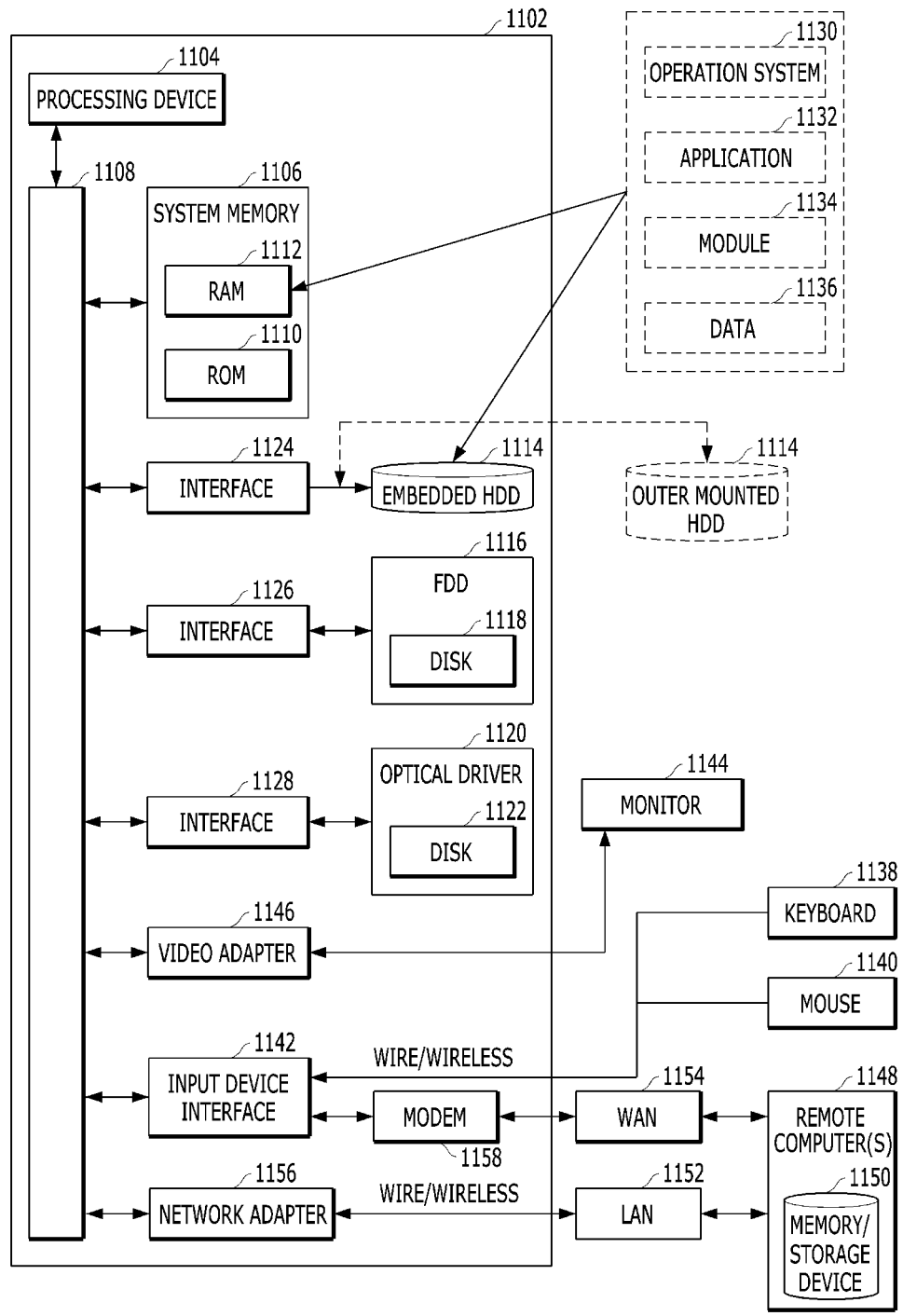

METHOD FOR LOGICAL CNOT OPERATION OF QUANTUM LOGICAL QUBITS

CROSS-REFERENCE TO RELATED APPLICATIONS

This application claims priority to and the benefit of Korean Patent Application Nos. 10-2022-0075912 filed on Jun. 22, 2022 and 10-2022-0113870 filed on Sep. 8, 2022, in the Korean Intellectual Property Office, the entire disclosures of which are incorporated herein by reference.

TECHNICAL FIELD

The present disclosure relates to a quantum error correction code, and more particularly, to a method for a logical CNOT operation of quantum logical qubits.

BACKGROUND ART

A quantum computing device may be a computing device that processes data by using a phenomenon related to quantum mechanics such as quantum entanglement, quantum superposition, etc. The quantum entanglement may mean a state in which two or more states are connected to each other by a quantum scheme, so that they cannot be handled separately in each state. The quantum superposition may mean that various result states by measurement are probabilistically present at the same time before measuring a quantum state. The quantum computing device may use a qubit as a basic unit of information for processing data by using the phenomenon related to the quantum dynamics.

The qubit may be capable of simultaneously expressing values corresponding to various bits by using a quantum superposition state. For example, the qubit may express each value with a probability like '0 with a probability of 20% and 1 with a probability of 80%'. The qubit may be determined as one state while the quantum superposition state is released when being measured.

In order to overcome difficulty of implementing quantum computing and quantum information communication due to noise or an error for quantum information, a surface code and a concatenated code are studied as a quantum error correcting code. In the surface code, a threshold for an error rate required for a physical qubit for the quantum error correcting code to efficiently operate is higher than that of the concatenated code, and the surface code may be utilized as the quantum error correcting code in the future.

A scheme that arranges encoded logical qubits may influence resources for a time and the number of qubits utilized when performing a specific quantum circuit by utilizing the corresponding qubits. Therefore, it is necessary to reduce the resources required for the time and the number of qubits required when performing the specific quantum circuit by efficiently arranging the encoded logical qubits.

SUMMARY OF THE INVENTION

The present disclosure has been made in an effort to provide a method for a logical CNOT operation of quantum logical qubits.

However, technical objects of the present disclosure are not restricted to the technical object mentioned above. Other unmentioned technical objects will be apparently appreciated by those skilled in the art by referencing to the following description.

An exemplary embodiment of the present disclosure provides a method for a logical CNOT operation of quantum logical qubits, which is performed by a quantum computing device, which may include: arranging a plurality of logical data qubits in a first column which is a horizontal column; arranging a plurality of logical ancilla qubits corresponding to the plurality of logical data qubits, respectively as a second column which is a horizontal column different from the first column to correspond to the plurality of logical data qubits, respectively; and performing logical controlled NOT (CNOT) for a first logical data qubit and a second logical data qubit among the plurality of logical data qubits.

Alternatively, the first logical data qubit may be a control qubit, and the second logical data qubit may be a target qubit.

Alternatively, each of the plurality of logical ancilla qubits may include an intermediate logical qubit.

Alternatively, the performing of the logical controlled NOT (CNOT) for the first logical data qubit and the second logical data qubit among the plurality of logical data qubits may include when there is no another logical data qubit between the first logical data qubit and the second logical data qubit, merging the first logical data qubit and a first logical ancilla qubit corresponding to the first logical data qubit to generate a first merging qubit, merging the second logical data qubit and a second logical ancilla qubit corresponding to the second logical data qubit to generate a second merging qubit, splitting the first merging qubit into the first logical data qubit and the first logical ancilla qubit, merging the split first logical ancilla qubit and the second merging qubit to generate a third merging qubit, and performing trimming of splitting the third merging qubit into the second logical data qubit, the first logical ancilla qubit, and the second logical ancilla qubit, and deactivating the first logical ancilla qubit and the second logical ancilla qubit.

Alternatively, the performing of the logical controlled NOT (CNOT) for the first logical data qubit and the second logical data qubit among the plurality of logical data qubits may include when there is at least one third logical data qubit between the first logical data qubit and the second logical data qubit, merging the first logical data qubit and a first logical ancilla qubit corresponding to the first logical data qubit to generate a fourth merging qubit, merging the second logical data qubit, a second logical ancilla qubit corresponding to the second logical data qubit, and at least one third logical ancilla qubit corresponding to at the least one third logical data qubit to generate a fifth merging qubit, splitting the fourth merging qubit into the first logical data qubit and the first logical ancilla qubit, merging the split first logical ancilla qubit and the fifth merging qubit to generate a sixth merging qubit, and performing trimming of splitting and initializing the sixth merging qubit into the second logical data qubit, the first logical ancilla qubit, the second logical ancilla qubit, and the at least one third logical ancilla qubit, and deactivating the first logical ancilla qubit, the second logical ancilla qubit, and the at least one third logical ancilla qubit.

Alternatively, the arranging of the plurality of logical data qubits in the first column which is the horizontal column may include arranging the plurality of logical data qubits in the first column based on the number of qubit operations related to a performing circuit.

Alternatively, the arranging of the plurality of logical data qubits in the first column based on the number of qubit operations related to the performing circuit may include arranging a fourth logical data qubit determined as a first priority at a center of the first column based on the number of qubit operations, arranging a fifth logical data qubit determined as a second priority on the first column to correspond to one side of the fourth logical data qubit based on the number of qubit operations, and arranging a sixth logical data qubit determined as a third priority on the first column to correspond to the other side of the fourth logical data qubit according to the number of qubit operations.

Alternatively, the method may further include: arranging a seventh logical data qubit determined as a fourth priority on the first column to correspond to one side of the sixth logical data qubit according to the number of qubit operations; and arranging an eighth logical data qubit determined as a fifth priority on the first column to correspond to one side of the fifth logical data qubit according to the number of qubit operations, and one side of the fifth logical data qubit may be a portion which does not correspond to one side of the fourth logical data qubit, and one side of the sixth logical data qubit may be a portion which does not correspond to the other side of the fourth logical data qubit.

Alternatively, the method may further include, when performing plurality of logical CNOTs, determining an order of operations of the plurality of logical CNOTs by using a routing algorithm including a scheduling function.

Another exemplary embodiment of the present disclosure provides a method for a logical CNOT operation of quantum logical qubits, which is performed by a quantum computing device, which may include: arranging a plurality of logical data qubits in at least one third column which is a horizontal column, including a predetermined number of logical data qubits; arranging a plurality of logical ancilla qubits correspondingly to the plurality of logical data qubits, respectively in at least one fourth column which is a horizontal column different from the at least one third column; arranging a plurality of additional logical ancilla qubits in at least one fifth column which is a vertical column to correspond to the at least one third column and at least one of a right end or a left end of the at least one fourth column; and performing logical controlled NOT (CNOT) for a ninth logical data qubit and a tenth logical data qubit among the plurality of logical data qubits.

According to an exemplary embodiment of the present disclosure, logical CNOT can be performed without positional movement between logical qubits which are not adjacent through a method for a logical CNOT operation of quantum logical qubits.

Effects which can be obtained in the present disclosure are not limited to the aforementioned effects and other unmentioned effects will be clearly understood by those skilled in the art from the following description.

BRIEF DESCRIPTION OF THE DRAWINGS

Various aspects are now described with reference to the drawings and like reference numerals are generally used to designate like elements. In the following exemplary embodiments, for the purpose of description, multiple specific detailed matters are presented to provide general understanding of one or more aspects. However, it will be apparent that the aspect(s) can be executed without the detailed matters.

FIG. 1 is a diagram illustrating a method for performing logical CNOT between logical qubits in the related art.

FIG. 2 is a block diagram of a quantum computing device for providing a logical CNOT operation of quantum logical qubits according to some exemplary embodiments of the present disclosure.

FIG. 3 is a diagram illustrating a layout for a logical CNOT operation of quantum logical qubits performed by a quantum computing device according to some exemplary embodiments of the present disclosure.

FIG. 4 is a diagram illustrating a logical CNOT operation process of quantum logical qubits performed by a quantum computing device according to some exemplary embodiments of the present disclosure.

FIG. 5 is a diagram illustrating a logical CNOT operation process of quantum logical qubits performed by a quantum computing device according to some other exemplary embodiments of the present disclosure.

FIG. 6 is a diagram illustrating a method of arranging a plurality of logical data qubits by a quantum computing device according to some exemplary embodiments of the present disclosure.

FIG. 7 is a diagram illustrating a layout for a logical CNOT operation of quantum logical qubits performed by a quantum computing device according to some other exemplary embodiments of the present disclosure.

FIG. 8 is a diagram illustrating a method for performing a logical CNOT operation of quantum logical qubits by a quantum computing device according to some exemplary embodiments of the present disclosure.

FIG. 9 is a diagram illustrating a method for performing a logical CNOT operation of quantum logical qubits by a quantum computing device according to some other exemplary embodiments of the present disclosure.

FIGS. 10 and 11 are diagrams illustrating a method for performing a logical CNOT operation of quantum logical qubits by a quantum computing device according to some exemplary embodiments of the present disclosure and a result output by inputting techniques in the related art into each circuit.

FIG. 12 is a diagram illustrating a method for performing a logical CNOT operation of quantum logical qubits by a quantum computing device according to some other exemplary embodiments of the present disclosure.

DETAILED DESCRIPTION

Various exemplary embodiments will now be described with reference to drawings. In the present specification, various descriptions are presented to provide appreciation of the present disclosure. However, it is apparent that the exemplary embodiments can be executed without the specific description.

"Component", "module", "system", and the like which are terms used in the specification refer to a computer-related entity, hardware, firmware, software, and a combination of the software and the hardware, or execution of the software. For example, the component may be a processing procedure executed on a processor, the processor, an object, an execution thread, a program, and/or a computer, but is not limited thereto. For example, both an application executed in a computing device and the computing device may be the components. One or more components may reside within the processor and/or a thread of execution. One component may be localized in one computer. One component may be distributed between two or more computers. Further, the components may be executed by various computer-readable media having various data structures, which are stored therein. The components may perform communication through local and/or remote processing according to a signal (for example, data transmitted from another system through a network such as the Internet through data and/or a signal from one component that interacts with other components in a local system and a distribution system) having one or more data packets, for example.

Moreover, the term "or" is intended to mean not exclusive "or" but inclusive "or". That is, when not separately specified or not clear in terms of a context, a sentence "X uses A or B" is intended to mean one of the natural inclusive substitutions. That is, the sentence "X uses A or B" may be applied to any of the case where X uses A, the case where X uses B, or the case where X uses both A and B. Further, it should be understood that the term "and/or" used in this specification designates and includes all available combinations of one or more items among enumerated related items.

Further, it should be appreciated that the term "comprise" and/or "comprising" means presence of corresponding features and/or components. However, it should be appreciated that the term "comprises" and/or "comprising" means that presence or addition of one or more other features, components, and/or a group thereof is not excluded. Further, when not separately specified or it is not clear in terms of the context that a singular form is indicated, it should be construed that the singular form generally means "one or more" in this specification and the claims.

In addition, the term "at least one of A or B" should be interpreted to mean "a case including only A", "a case including only B", and "a case in which A and B are combined".

Those skilled in the art need to recognize that various illustrative logical blocks, configurations, modules, circuits, means, logic, and algorithm steps described in connection with the exemplary embodiments disclosed herein may be additionally implemented as electronic hardware, computer software, or combinations of both sides. To clearly illustrate the interchangeability of hardware and software, various illustrative components, blocks, configurations, means, logic, modules, circuits, and steps have been described above generally in terms of their functionalities. Whether the functionalities are implemented as the hardware or software depends on a specific application and design restrictions given to an entire system. Skilled artisans may implement the described functionalities in various ways for each particular application. However, such implementation decisions should not be interpreted as causing a departure from the scope of the present disclosure.

The description of the presented exemplary embodiments is provided so that those skilled in the art of the present disclosure use or implement the present disclosure. Various modifications to the exemplary embodiments will be apparent to those skilled in the art. Generic principles defined herein may be applied to other embodiments without departing from the scope of the present disclosure. Therefore, the present disclosure is not limited to the exemplary embodiments presented herein. The present disclosure should be analyzed within the widest range which is coherent with the principles and new features presented herein.

In the present disclosure, terms expressed as N-th such as first, second, or third are used in order to distinguish at least one entity. For example, entities such as first and second may be the same as different from each other.

FIG. 1 is a diagram illustrating a method for performing logical CNOT between logical qubits in the related art. The method for performing the logical CNOT among the logical qubits in the related art disclosed in FIGS. 1A to 1E may be sequentially performed.

Referring to FIG. 1A, the quantum computing device in the related art may arrange a control qubit 1 and a target qubit 2 in a diagonal line in Lattice Surgery, and additionally arrange an intermediate logical qubit 3. Here, the control qubit 1 may be $|1\rangle$, the target qubit 2 may be $|0\rangle$, and the intermediate logical qubit 3 may be $|0\rangle$.

Referring to FIG. 1B, the quantum computing device in the related art may generate a merge qubit 4 by merging the target qubit 2 and the intermediate logical qubit 3. Here, the merging may include Z-boundary merging. Here, the merge qubit 4 may be $|0\rangle = |+\rangle + |-\rangle$.

Referring to FIG. 1C, the quantum computing device in the related art may split the merge qubit 4 into the target qubit 2 and the intermediate logical qubit 3. Here, the splitting may include Z-boundary splitting. Here, the control qubit 1 may be "$|1\rangle = |+-|-\rangle$", and the target qubit 2 and the intermediate logical qubit 3 may be "$|++\rangle |--\rangle$".

Referring to FIG. 1D, the quantum computing device in the related art may generate a merge qubit 5 by merging the control qubit 1 and the intermediate logical qubit 3. Here, the merging may include X-boundary splitting. Here, the control qubit 1 and the target qubit 2 may be "$|++\rangle + |--\rangle - |+-\rangle - |-+\rangle = |11\rangle$".

Referring to FIG. 1E, the quantum computing device in the related art may split the merge qubit 5, and perform trimming of deactivating the intermediate logical qubit 3. Here, the control qubit 1 and the target qubit 2 may be "$|++\rangle + |--\rangle - |+-\rangle - |-+\rangle = |11\rangle$".

Referring to FIGS. 1A to 1E, when the control qubit 1 is $|1\rangle$ and the target qubit 2 is $|1\rangle$, a result of logical CNOT may be "$|11\rangle$". Here, the target qubit 2 may changed from "$|0\rangle$" to "$|1\rangle$" through a flip. Therefore, when the control bit is "0", the logical CNOT among the logical qubits may output the target bit as it is and when the control bit "1", the logical CNOT may correspond to a CNOT operation of flipping the target bit (e.g., changing "0" to "1", changing "1" to "0", etc.). For example, when the control bit is "1" and the target bit is "0" the CNOT operation may output the target bit as "1".

As described above by referring to FIG. 1, in the method for performing the logical CNOT among the logical qubits in the related art, the control qubit and the target qubit should be adjacent to each other and arranged in the diagonal line. Therefore, in the method for performing the logical CNOT among the logical qubits in the related art, when the control qubit and the target qubit are not adjacent to each other, that is, when the control qubit and the target qubit are arranged in a remote distance, a SWAP gate should be used, which switches locations of the control qubit and the target qubit. Therefore, in the method for performing the logical CNOT among the logical qubits in the related art, a long operation time is required and a lot of resources are required due to a process of switching the locations so that the control qubit and the target qubit are arranged in the diagonal line by using the SWAP gate, so it may be inefficient.

A thesis (Horsman, C., Fowler, A. G., Devitt, S., Van Meter, R., Surface code quantum computing by lattice surgery. New Journal of Physics 14(12), 123011 (2012)) related to definition of specific methodologies associated with Lattice Surgery such as Z-boundary merging, Z-boundary splitting, X-boundary splitting, trimming, logical CNOT, etc., is disclosed, and the thesis is incorporated into the patent application for reference.

FIG. 2 is a block diagram of a quantum computing device for providing a logical CNOT operation of quantum logical qubits according to some exemplary embodiments of the present disclosure.

A configuration of the quantum computing device illustrated in FIG. 2 is only an example shown through simplification. In an exemplary embodiment of the present disclosure, the quantum computing device may include other components for performing a method for a logical CNOT operation of quantum logical qubits, and only some of the disclosed components may constitute the computing device.

Referring to FIG. 2, the quantum computing device 100 may perform the logical CNOT operation of the quantum logical qubits.

The quantum computing device 100 may include a processor 110, a memory 130, and a network unit 150. The processor 110 may be constituted by one or more cores and may include processors for data analysis and quantum processing, which include a central processing unit (CPU), a general purpose graphics processing unit (GPGPU), a tensor processing unit (TPU), and the like of the computing device. The processor 110 may generally control an overall operation of the quantum computing device 100. For example, the processor 110 may process signals, data information, etc., input or output through the components included in the quantum computing device 100. As another example, the processor 110 may read a computer program stored in the memory 130 to perform quantum processing according to an exemplary embodiment of the present disclosure.

According to some exemplary embodiments of the present disclosure, the memory 130 may store any type of information generated or determined by the processor 110 and any type of information received by the network unit 150.

According to some exemplary embodiments of the present disclosure, the memory 130 may include at least one type of storage medium of a flash memory type storage medium, a hard disk type storage medium, a multimedia card micro type storage medium, a card type memory (for example, an SD or XD memory, or the like), a random access memory (RAM), a static random access memory (SRAM), a read-only memory (ROM), an electrically erasable programmable read-only memory (EEPROM), a programmable read-only memory (PROM), a magnetic memory, a magnetic disk, and an optical disk. A first node 100 may operate in connection with a web storage performing a storing function of the memory 130 on the Internet. The description of the memory is just an example and the present disclosure is not limited thereto. The network unit 150 according to some exemplary embodiments of the present disclosure may include an arbitrary wired/wireless communication network which may transmit/receive an arbitrary type of data and signal. The techniques described in this specification may also be used in other networks in addition to the aforementioned networks.

According to some exemplary embodiments of the present disclosure, the processor 110 of the quantum computing device 100 may arrange a plurality of logical data qubits as a first column which is a horizontal column. The plurality of logical data qubits may be qubits which operate as specified in a quantum circuit which becomes a target of a quantum algorithm or single conversion.

The processor 110 may arrange the plurality of logical data qubits as the first column based on the number of qubit operations related to a performing circuit.

For example, the processor 110 may arrange fourth logical data qubit a determined as a first priority at a center of the first column based on the number of qubit operations. The processor 110 may arrange a fifth logical data qubit c determined as a second priority on the first column to correspond to one side of the fourth logical data qubit a based on the number of qubit operations. The processor 110 may arrange a sixth logical data qubit b determined as a third priority on the first column to correspond to the other side of the fourth logical data qubit a based on the number of qubit operations. The processor 110 may arrange a seventh logical data qubit d determined as a fourth priority on the first column to correspond to one side of the sixth logical data qubit b based on the number of qubit operations. The processor 110 may arrange an eighth logical data qubit e determined as a fifth priority on the first column to correspond to one side of the fifth logical data qubit c based on the number of qubit operations. One side of the fifth logical data qubit c may be a portion which does not correspond to one side of the fourth logical data qubit a. One side of the sixth logical data qubit b may be a portion which does not correspond to the other side of the fourth logical data qubit a. The detailed description thereof will be made below with reference to FIG. 6.

The processor 110 may arrange a plurality of logical ancilla qubits corresponding to the plurality of logical data qubits, respectively as a second column which is a horizontal column different from the first column to correspond to the plurality of logical data qubits, respectively.

The plurality of logical ancilla qubits may be qubits added to achieve a specific goal in calculations. For example, the plurality of logical ancilla qubits may be qubits arranged for the operation in a quantum gate.

Each of the plurality of logical ancilla qubits may include an intermediate logical qubit. The intermediate logical qubit may be a qubit used for the operation between the control qubits and the target qubit included in the plurality of logical data qubits. The control qubit may be a set of at least one physical qubit used for encoding a logical qubit in a CNOT gate. The control qubit may be a qubit for controlling the target qubit in the CNOT gate. For example, when the control qubit is $|1\rangle$ in the CNOT gate, the target qubit may be flipped (for example, when the target qubit is "$|0\rangle$", the target qubit may be changed to "$|1\rangle$"). The target qubit may be a qubit changed by the control qubit in the CNOT gate.

The processor 110 may perform logical controlled NOT (CNOT) for a first logical data qubit and a second logical data qubit among the plurality of logical data qubits.

The first logical data qubit may be the control qubit. In addition, the second logical data qubit may be the target qubit.

According to an exemplary embodiment, when there is no another logical data qubit between the first logical data qubit and the second logical data qubit, the processor 110 merges the first logical data qubit and a first logical ancilla qubit corresponding to the first logical data qubit to generate a first merging qubit.

The processor 110 merges the second logical data qubit and a second logical ancilla qubit corresponding to the second logical data qubit to generate a second merging qubit.

The processor 110 may split the first merging qubit into the first logical data qubit and the first logical ancilla qubit.

The processor 110 merges the split first logical ancilla qubit and the second merging qubit to generate a third merging qubit.

The processor 110 may perform trimming of splitting the third merging qubit into the second logical data qubit, the first logical ancilla qubit, and the second logical ancilla qubit, and deactivating the first logical ancilla qubit and the second logical ancilla qubit. The detailed description thereof will be made below with reference to FIG. 4.

According to another exemplary embodiment, when there is at least one third logical data qubit between the first logical data qubit and the second logical data qubit, the processor 110 merges the first logical data qubit and a first logical ancilla qubit corresponding to the first logical data qubit to generate a fourth merging qubit.

The processor 110 merges the second logical data qubit, the second logical ancilla qubit corresponding to the second logical data qubit, and at least one third logical ancilla qubit corresponding to at least one third logical data qubit to generate a fifth merging qubit.

The processor 110 may split the fourth merging qubit into the first logical data qubit and the first logical ancilla qubit.

The processor 110 merges the split first logical ancilla qubit and the fifth merging qubit to generate a sixth merging qubit.

The processor 110 may perform trimming of splitting the sixth merging qubit into the second logical data qubit, the first logical ancilla qubit, the second logical ancilla qubit, and at least one third logical ancilla qubit, and deactivating the first logical ancilla qubit, the second logical ancilla qubit, and at least one third logical ancilla qubit. The detailed description thereof will be made below with reference to FIG. 5.

When the processor 110 performs plurality of logical CNOTs, the processor 110 may determine an order of the operations of the plurality of logical CNOTs by using a routing algorithm including a scheduling function.

The routing algorithm may be an algorithm that determines the order of the plurality of logical CNOT operations by calling the scheduling function when there is a plurality of logical CNOTs which may not be simultaneously performed.

The scheduling function may be a function to determine the order of the operation based on a predetermined priority. The predetermined priority may be determined as a low order or a high order based on an anticipated operation time, a resource required for the operation, etc.

Therefore, the processor 110 may determine the order of the plurality of logical CNOT operations by using the routing algorithm when there is the plurality of logical CNOTs which may not be simultaneously performed. The processor 110 may simultaneously perform the plurality of logical CNOTs which may be simultaneously performed.

According to some exemplary embodiments of the present disclosure, the processor 110 of the quantum computing device 100 may arrange the plurality of logical data qubits in at least one third column which is a horizontal column including a predetermined number of logical data qubits.

The processor 110 may arrange the plurality of logical ancilla qubits corresponding to the plurality of logical data qubits, respectively in at least one fourth column which is a horizontal column different from at least one third column.

The processor 110 may arrange a plurality of additional logical ancilla qubits as at least one fifth column which is a vertical column to correspond to at least one of at least one third column and a right end and a left end of at least one fourth column.

The processor 110 may perform logical controlled NOT (CNOT) for a ninth logical data qubit and a tenth logical data qubit among the plurality of logical data qubits. The detailed description thereof will be made below with reference to FIG. 7.

FIG. 3 is a diagram illustrating a layout for a logical CNOT operation of quantum logical qubits performed by a quantum computing device according to some exemplary embodiments of the present disclosure.

Referring to FIG. 3, the processor 110 of the quantum computing device 100 may arrange a plurality of logical data qubits 200 (e.g., a first logical data qubit 210, a second logical data qubit 220, a third logical data qubit 230, a fourth logical data qubit 240, a fifth logical data qubit 250, a sixth logical data qubit 260, a seventh logical data qubit 270, an eighth logical data qubit 280, etc.) in a first column 10 which is the horizontal column.

Further, the processor 110 may arrange a plurality of logical ancilla qubits 300 (e.g., a first logical ancilla qubit 310, a second logical ancilla qubit 320, a third logical ancilla qubit 330, a fourth logical ancilla qubit 340, a fifth logical ancilla qubit 350, a sixth logical ancilla qubit 360, a seventh logical ancilla qubit 370, an eighth logical ancilla qubit 380, etc.) corresponding to the plurality of logical data qubits 200, respectively in a second column 20 which is the horizontal column. For example, the processor 110 may arrange a first logical ancilla qubit 310 below the first logical data qubit 210. The layout described above with reference to FIG. 3 may be row type arch (r-arch). Therefore, the processor 110 may arrange the plurality of logical data qubits in the first column which is the horizontal column, and arranges the plurality of logical ancilla qubits corresponding to the plurality of logical data qubits, respectively in the second column which is a horizontal column different from the first column to correspond to the plurality of logical data qubits, respectively and arrange the plurality of logical ancilla qubits as the row type arch.

FIG. 4 is a diagram illustrating a logical CNOT operation process of quantum logical qubits performed by a quantum computing device according to some exemplary embodiments of the present disclosure.

Referring to FIG. 4A, the processor 110 of the quantum computing device 100 may arrange a first logical data qubit 410 and a second logical data qubit 420 in the first column which is the horizontal column, and arrange a first logical ancilla qubit 510 and a second logical ancilla qubit 520 in the second column which is the horizontal column.

Referring to FIG. 4B, when the processor 110 performs the logical CNOT for the first logical data qubit 410 and the second logical data qubit 420 among the plurality of logical data qubits, the processor 110 merges the first logical data qubit 410 and the first logical ancilla qubit 510 to generate a first merging qubit 610. The processor 110 merges the second logical data qubit 420 and the second logical ancilla qubit 520 to generate a second merging qubit 620. Here, the merging may include X-boundary merging. The first logical data qubit 410 may be the control qubit and the second logical data qubit 420 may be the target qubit.

Referring to FIG. 4C, the processor 110 may split the first merging qubit 610 into the first logical data qubit 410 and the first logical ancilla qubit 510. Here, the splitting may include X-boundary splitting.

Referring to FIG. 4D, the processor 110 merges the split first logical ancilla qubit 510 and the second merging qubit 620 to generate a third merging qubit 630. Here, the merging may include Z-boundary merging.

Referring to FIG. 4E, the processor 110 may split the third merging qubit 630 into the second logical data qubit 420, the first logical ancilla qubit 510, and the second logical ancilla qubit 520. The processor 110 may initialize the first logical ancilla qubit 510 and the second logical ancilla qubit 520.

FIG. 5 is a diagram illustrating a logical CNOT operation process of quantum logical qubits performed by a quantum computing device according to some other exemplary embodiments of the present disclosure.

Referring to FIG. 5A, the processor 110 of the quantum computing device 100 may arrange a first logical data qubit 710, a second logical data qubit 740, a third logical data qubit 720 and the fourth logical data qubit 730 in the first column which is the horizontal column, and arrange a first logical ancilla qubit 810, a second logical ancilla qubit 840, a third logical ancilla qubit 820, and a fourth logical ancilla qubit 830 in the second column which is the horizontal column.

Referring to FIG. 5B, other logical data qubits (the third logical data qubit 720 and the fourth logical data qubit 730) may be present in the first logical data qubit 710 and the second logical data qubit 740. That is, the processor 110 may not perform the logical CNOT between adjacent logical data qubits, but perform the logical CNOT between logical data qubits which are arranged at a long distance.

When the processor 110 performs the logical CNOT for the first logical data qubit 710 and the second logical data qubit 740 among the plurality of logical data qubits, the processor 110 merges the first logical data qubit 710 and the first logical ancilla qubit 810 to generate a first merging qubit 910. The processor 110 merges the second logical data qubit 740, the second logical ancilla qubit 840, the third logical ancilla qubit 820, and the fourth logical ancilla qubit 830 to generate a second merging qubit 920.

Specifically, the processor 110 may X-boundary merge the first logical data qubit 710 and the first logical ancilla qubit 810. The processor 110 may Z-boundary merge the second logical ancilla qubit 840, the third logical ancilla qubit 820, and the fourth logical ancilla qubit 830, and X-boundary merge a qubit acquired by Z-boundary merging the second logical ancilla qubit 840, the third logical ancilla qubit 820, and the fourth logical ancilla qubit 830, and the second logical data qubit 740. Here, the first logical data qubit 710 may be the control qubit and the second logical data qubit 740 may be the target qubit.

Referring to FIG. 5C, the processor 110 may split a first merging qubit 910 into the first logical data qubit 710 and the first logical ancilla qubit 810. Here, the splitting may include X-boundary splitting.

Referring to FIG. 5D, the processor 110 merges the first logical ancilla qubit 810 and the second merging qubit 920 to generate a third merging qubit 930. Here, the merging may include Z-boundary merging.

Referring to FIG. 5E, the processor 110 may split the third merging qubit 930 into the second logical data qubit 740, the first logical ancilla qubit 810, the second logical ancilla qubit 840, the third logical ancilla qubit 820, and the fourth logical ancilla qubit 830.

The processor 110 may initialize the first logical ancilla qubit 810, the second logical ancilla qubit 840, the third logical ancilla qubit 820, and the fourth logical ancilla qubit 830.

The processor 110 may perform the logical CNOT based on a lattice surgery scheme through the layout of the logical qubit as described above with reference to FIG. 5. Even another logical qubit is arranged between the logical qubits performing the logical CNOT, the processor 110 may perform the CNOT without addition of a SWAP operation. Therefore, since the processor 110 does not require the additional SWAP operation, when the quantum error correction code performs the quantum algorithm, a quantum volume resource which is a multiple of the performing time, the number of physical qubits, and the performing time may be reduced.

FIG. 6 is a diagram illustrating a method of arranging a plurality of logical data qubits by a quantum computing device according to some exemplary embodiments of the present disclosure.

Referring to FIG. 6A, it can be seen that the number of 2-qubit operators of a which is the logical data qubit is 5, the number of 2-qubit operators of b which is the logical data qubit is 3, the number of 2-qubit operators of c which is the logical data qubit is 4, and the numbers of 2-qubit operators of d and e which are the logical data qubits are 2.

Referring to FIG. 6B, the processor 110 of the quantum computing device 100 may arrange the plurality of logical data qubits in the first column based on the number of qubit operations related to a performing circuit.

For example, the processor 110 may arrange a determined as a first priority at a center of the first column based on the number of qubit operations.

The processor 110 may arrange c determined as a second priority on the first column to correspond to one side of (e.g., a left side of a) a based on the number of qubit operations.

The processor 110 may arrange b determined as a third priority on the first column to correspond to the other side (e.g., a right side of a) of a based on the number of qubit operations.

When the numbers of qubit operations of the plurality of logical data qubits are equal to each other, the processor 110 may determine the priority by a predetermined scheme. The predetermined scheme may include a scheme of randomly determining the priority, a scheme of determining the priority according to a predetermined order (e.g., an alphabetical order, an order of a small number, etc.), etc. For example, the processor 110 may determine the priority randomly among the plurality of logical data qubits having the equal number of qubit operations.

The processor 110 may arrange d determined as a fourth priority on the first column to correspond to one side (e.g., a right side of b) of b based on the priority determined by the predetermined scheme. One side of b may be a portion which does not correspond to the other side (e.g., the right side of a) of a. That is, one side of b may be the right side of b other than a left side of b contacting a.

The processor 110 may arrange e determined as a fifth priority on the first column to correspond to one side (e.g., the left side of c) of c based on the priority determined by the predetermined scheme. One side of c may be a portion which does not correspond to one side (e.g., the left side of a) of a. That is, one side of c may be the left side of c other than the right side of c contacting a.

FIG. 7 is a diagram illustrating a layout for a logical CNOT operation of quantum logical qubits performed by a quantum computing device according to some other exemplary embodiments of the present disclosure.

Referring to FIG. 7, the processor 110 of the quantum computing device 100 may arrange a plurality of logical data qubits 1110 to 1180 in at least one third column 31 and 32 which is a horizontal column including a predetermined number of logical data qubits.

The processor 110 may arrange a plurality of logical ancilla qubits 1210 to 1280 corresponding to the plurality of logical data qubits, respectively as at least one fourth column 41 and 42 which is a horizontal column different from at least one of the third columns 31 and 32.

The processor 110 may arrange a plurality of additional logical ancilla qubits 1310 to 1380 as at least one fifth column 51 and 52 which is a vertical column to correspond to at least one of the third columns 31 and 32 and at least one of a right end and a left end of at least one of the fourth columns 41 and 42.

The processor 110 may perform logical controlled NOT (CNOT) for a plurality of (e.g., two) logical data qubits among the plurality of logical data qubits. For example, the processor 110 may perform the logical CNOT for a first logical data qubit 1110 and a second logical data qubit 1120.

The layout described above with reference to FIG. 7 may be modified row type arch (modi r-arch). Therefore, the processor 110 may arrange a plurality of logical data qubits in at least one third column which is a horizontal column, including a predetermined number of logical data qubits, arrange a plurality of logical ancilla qubits corresponding to the plurality of logical data qubits, respectively in at least one fourth column which is a horizontal column different from at least one third column, and arrange a plurality of additional logical ancilla qubits in at least one fifth column which is a vertical column to correspond to at least one third column and at least one of a right end or a left end of at least one fourth column, and arrange the qubits as the modified row type arch.

FIG. 8 is a diagram illustrating a method for performing a logical CNOT operation of quantum logical qubits by a quantum computing device according to some exemplary embodiments of the present disclosure.

Referring to FIG. 8, the processor 110 of the quantum computing device 100 may arrange a plurality of logical data qubits in a first column which is a horizontal column (S110).

The processor 110 may arrange the plurality of logical data qubits as the first column based on the number of qubit operations related to a performing circuit.

The processor 110 may arrange fourth logical data qubit determined as a first priority at a center of the first column based on the number of qubit operations.

The processor 110 may arrange a fifth logical data qubit determined as a second priority on the first column to correspond to one side of the fourth logical data qubit based on the number of qubit operations.

The processor 110 may arrange a sixth logical data qubit determined as a third priority on the first column to correspond to the other side of the fourth logical data qubit based on the number of qubit operations.

The processor 110 may arrange a seventh logical data qubit determined as a fourth priority on the first column to correspond to one side of the sixth logical data qubit based on the number of qubit operations.

The processor 110 may arrange an eighth logical data qubit determined as a fifth priority on the first column to correspond to one side of the fifth logical data qubit based on the number of qubit operations.

The one side of the fifth logical data qubit may be a portion which does not correspond to one side of the fourth logical data qubit, and one side of the sixth logical data qubit may be a portion which does not correspond to the other side of the fourth logical data qubit.

The processor 110 may arrange a plurality of logical ancilla qubits corresponding to the plurality of logical data qubits, respectively as a second column which is a horizontal column different from the first column to correspond to the plurality of logical data qubits, respectively (S120).

Each of the plurality of logical ancilla qubits may include an intermediate logical qubit.

When there is no another logical data qubit between the first logical data qubit and the second logical data qubit, the processor 110 merges the first logical data qubit and a first logical ancilla qubit corresponding to the first logical data qubit to generate a first merging qubit.

The processor 110 merges the second logical data qubit and a second logical ancilla qubit corresponding to the second logical data qubit to generate a second merging qubit.

The processor 110 may split the first merging qubit into the first logical data qubit and the first logical ancilla qubit.

The processor 110 merges the split first logical ancilla qubit and the second merging qubit to generate a third merging qubit.

The processor 110 may perform trimming of splitting the third merging qubit into the second logical data qubit, the first logical ancilla qubit, and the second logical ancilla qubit, and deactivating the first logical ancilla qubit and the second logical ancilla qubit.

In an exemplary embodiment, when there is at least one third logical data qubit between the first logical data qubit and the second logical data qubit, the processor 110 merges the first logical data qubit and a first logical ancilla qubit corresponding to the first logical data qubit to generate a fourth merging qubit.

The processor 110 merges the second logical data qubit, the second logical ancilla qubit corresponding to the second logical data qubit, and at least one third logical ancilla qubit corresponding to at least one third logical data qubit to generate a fifth merging qubit.

The processor 110 may split the fourth merging qubit into the first logical data qubit and the first logical ancilla qubit.

The processor 110 merges the split first logical ancilla qubit and the fifth merging qubit to generate a sixth merging qubit.

The processor 110 may perform trimming of splitting the sixth merging qubit into the second logical data qubit, the first logical ancilla qubit, the second logical ancilla qubit, and at least one third logical ancilla qubit, and deactivating the first logical ancilla qubit, the second logical ancilla qubit, and at least one third logical ancilla qubit.

The processor 110 may perform logical controlled NOT (CNOT) for a first logical data qubit and a second logical data qubit among the plurality of logical data qubits (S130).

The first logical data qubit may be the control qubit and the second logical data qubit may be the target qubit.

When the processor 110 performs plurality of logical CNOTs, the processor 110 may determine an order of the operations of the plurality of logical CNOTs by using a routing algorithm including a scheduling function.

FIG. 9 is a diagram illustrating a method for performing a logical CNOT operation of quantum logical qubits by a quantum computing device according to some other exemplary embodiments of the present disclosure.

The processor 110 may arrange the plurality of logical data qubits in at least one third column which is a horizontal column including a predetermined number of logical data qubits.

The processor 110 may arrange the plurality of logical ancilla qubits corresponding to the plurality of logical data qubits, respectively in at least one fourth column which is a horizontal column different from at least one third column.

The processor 110 may arrange a plurality of additional logical ancilla qubits in at least one fifth column which is a vertical column to correspond to at least one third column and at least one of a right end and a left end of at least one fourth column.

The processor 110 may perform logical controlled NOT (CNOT) for a ninth logical data qubit and a tenth logical data qubit among the plurality of logical data qubits.

The steps illustrated in FIGS. 8 and 9 are exemplary steps. Therefore, it is also apparent that some of the steps of FIGS. 8 and 9 may be omitted or additional steps may be present in the limit that does not depart from the scope of the idea of the spirit of the present disclosure. Further, specific contents regarding the components (e.g., components of the quantum computing device 100) disclosed in FIGS. 8 and 9 may be replaced with the contents described through FIGS. 1 and 7 above.

The quantum computing device 100 according to some exemplary embodiments of the present disclosure may perform the logical CNOT based on a lattice surgery scheme through the layout of the logical qubit as described above with reference to FIGS. 1 to 9.

Even another logical qubit is arranged between the logical qubits performing the logical CNOT, the quantum computing device 100 may perform the CNOT without addition of a SWAP operation. Therefore, since the quantum computing device 100 does not require the additional SWAP operation, when the quantum error correction code performs the quantum algorithm, a quantum volume resource which is a multiple of the execution time, the number of physical qubits, and the execution time may be reduced.

The quantum computing device 100 may increase a speed of the operation by determining the order of the operations of the plurality of logical CNOTs by using the routing algorithm including the scheduling function.

FIGS. 10 and 11 are diagrams illustrating a method for performing a logical CNOT operation of quantum logical qubits by a quantum computing device according to some exemplary embodiments of the present disclosure and a result output by inputting techniques in the related art into each circuit.

Qubit efficiency may be a ratio of the number of logical data qubits included in a reserved quantum circuit and the total number of logical qubits.

Circuit latency may be an execution time of the quantum circuit at syndrome measurement cycles. A code distance d may be reduced when the circuit latency is lower, and this may cause a smaller number of physical qubits to be consumed.

A quantum volume may be a value acquired by multiplying the number of physical qubits by a circuit latency time.

[[7,1,3]] and [[15,1,3]] encoding circuits may be used for $|Y\rangle_L$ state distillation and $|A\rangle_L$ state distillation, respectively. A short (15) circuit may be implemented heuristically. A Toffoli gate may be disassembled into Hadamard, CNOT, and T gates. Adder0-5 and Adder1-8 may be two types of adders. An arch size may be a size of each layout R×C, and here, R and C may be logical data qubits of a row and a column, respectively.

Specific details of each circuit may correspond to contents disclosed in Table 1 below.

TABLE 1

| Benchmarks | #Qubits | #Gates | #CNOT | #CNOT/#Gates | t-, c- arch size | Modified r-arch size |
|---|---|---|---|---|---|---|
| [[7, 1, 3]] | 7 | 21 | 11 | 52.38% | 3 × 3 | 2 × 4 |
| [[15, 1, 3]] | 15 | 53 | 34 | 64.15% | 4 × 4 | 3 × 5 |
| Shor15(a = 7) | 6 | 231 | 90 | 38.96% | 3 × 3 | 2 × 3 |
| Adder0-5 | 16 | 306 | 128 | 41.83% | 4 × 4 | 4 × 4 |
| Adder1-8 | 18 | 291 | 129 | 44.33% | 5 × 5 | 4 × 5 |

The qubit efficiency may correspond to contents disclosed in Table 2 below.

TABLE 2

|  | [[7, 1, 3]] | [[15, 1, 3]] | Shor(15) | Adder0-5 | Adder1-8 |
|---|---|---|---|---|---|
| r-arch | 7/14 | 15/30 | 6/12 | 16/32 | 18/36 |
| Modified r-arch | 7/20 | 15/42 | 6/16 | 16/56 or 16/48 | 18/56 |
| c-arch | 7/18 | 15/32 | 6/18 | 16/32 | 18/50 |
| t-arch | 7/36 | 15/64 | 6/36 | 16/64 | 18/100 |

Referring to Table 2, as a result of testing the methods (r-arch and modi r-arch) in each circuit according to some exemplary embodiments of the present disclosure, and the method (t-arch and c-arch) in the related art in each circuit, it can be seen that the qubit efficiency of r-arch is ½ for all benchmarks, and are shown to be higher than c-arch and t-arch by up to 16% and 33%, respectively. An efficiency value of the modi r-arch may be smaller than ½. The modi r-arch may show better efficiency than the t-arch by 8 to 20% in all benchmarks.

Referring to FIG. 10, as the result of testing the methods (r-arch and modi r-arch) in each circuit according to some exemplary embodiments of the present disclosure, and the method (t-arch and c-arch) in the related art in each circuit, it can be seen that the methods (r-arch and modi r-arch) in each circuit according to some exemplary embodiments of the present disclosure have smaller circuit latency than the method (t-arch and c-arch) in the related art in [[7,1,3]], Shor(15), Adder0-5, and Adder1-8. Therefore, the methods (r-arch and modi r-arch) in each circuit according to some exemplary embodiments of the present disclosure have a smaller execution time of quantum circuit than the method (t-arch and c-arch) in the related art in [[7,1,3]], Shor(15), Adder0-5, and Adder1-8, so it may be efficient.

Referring to FIG. 11, as the result of testing the methods (r-arch and modi r-arch) in each circuit according to some exemplary embodiments of the present disclosure, and the method (t-arch and c-arch) in the related art in each circuit, it can be seen that the methods (r-arch and modi r-arch) in each circuit according to some exemplary embodiments of the present disclosure have a smaller quantum volume than the method (t-arch and c-arch) in the related art in all circuits. Therefore, the methods (r-arch and modi r-arch) in each circuit according to some exemplary embodiments of the present disclosure may perform the quantum circuit by utilizing a smaller number of resources than the method (t-arch and c-arch) in the related art in [[7,1,3]], Shor(15), Adder0-5, and Adder1-8, so it may be efficient.

FIG. 12 is a simple and general schematic diagram illustrating an example of a computing environment in which exemplary embodiments of the present disclosure are implementable.

The present disclosure has been described as being generally implementable by the computing device, but those skilled in the art will appreciate well that the present disclosure is combined with computer executable commands and/or other program modules executable in one or more computers and/or be implemented by a combination of hardware and software.

In general, a program module includes a routine, a program, a component, a data structure, and the like performing a specific task or implementing a specific abstract data form. Further, those skilled in the art will well appreciate that the method of the present disclosure may be carried out by a personal computer, a hand-held computing device, a microprocessor-based or programmable home appliance (each of which may be connected with one or more relevant devices and be operated), and other computer system configurations, as well as a single-processor or multiprocessor computer system, a mini computer, and a main frame computer.

The exemplary embodiments of the present disclosure may be carried out in a distribution computing environment, in which certain tasks are performed by remote processing devices connected through a communication network. In the distribution computing environment, a program module may be located in both a local memory storage device and a remote memory storage device.

The computer generally includes various computer readable media. The computer accessible medium may be any type of computer readable medium, and the computer readable medium includes volatile and non-volatile media, transitory and non-transitory media, and portable and non-portable media. As a non-limited example, the computer readable medium may include a computer readable storage medium and a computer readable transmission medium. The computer readable storage medium includes volatile and non-volatile media, transitory and non-transitory media, and portable and non-portable media constructed by a predetermined method or technology, which stores information, such as a computer readable command, a data structure, a program module, or other data. The computer readable storage medium includes a RAM, a Read Only Memory (ROM), an Electrically Erasable and Programmable ROM (EEPROM), a flash memory, or other memory technologies, a Compact Disc (CD)-ROM, a Digital Video Disk (DVD), or other optical disk storage devices, a magnetic cassette, a magnetic tape, a magnetic disk storage device, or other magnetic storage device, or other predetermined media, which are accessible by a computer and are used for storing desired information, but is not limited thereto.

The computer readable transport medium generally implements a computer readable command, a data structure, a program module, or other data in a modulated data signal, such as a carrier wave or other transport mechanisms, and includes all of the information transport media. The modulated data signal means a signal, of which one or more of the characteristics are set or changed so as to encode information within the signal. As a non-limited example, the computer readable transport medium includes a wired medium, such as a wired network or a direct-wired connection, and a wireless medium, such as sound, Radio Frequency (RF), infrared rays, and other wireless media. A combination of the predetermined media among the foregoing media is also included in a range of the computer readable transport medium.

An illustrative environment 1100 including a computer 1102 and implementing several aspects of the present disclosure is illustrated, and the computer 1102 includes a processing device 1104, a system memory 1106, and a system bus 1108. The system bus 1108 connects system components including the system memory 1106 (not limited) to the processing device 1104. The processing device 1104 may be a predetermined processor among various commonly used processors. A dual processor and other multiprocessor architectures may also be used as the processing device 1104.

The system bus 1108 may be a predetermined one among several types of bus structure, which may be additionally connectable to a local bus using a predetermined one among a memory bus, a peripheral device bus, and various common bus architectures. The system memory 1106 includes a ROM 1110, and a RAM 1112. A basic input/output system (BIOS) is stored in a non-volatile memory 1110, such as a ROM, an EPROM, and an EEPROM, and the BIOS includes a basic routing helping a transport of information among the constituent elements within the computer 1102 at a time, such as starting. The RAM 1112 may also include a high-rate RAM, such as a static RAM, for caching data.

The computer 1102 also includes an embedded hard disk drive (HDD) 1114 (for example, enhanced integrated drive electronics (EIDE) and serial advanced technology attachment (SATA))—the embedded HDD 1114 being configured for exterior mounted usage within a proper chassis (not illustrated)—a magnetic floppy disk drive (FDD) 1116 (for example, which is for reading data from a portable diskette 1118 or recording data in the portable diskette 1118), and an optical disk drive 1120 (for example, which is for reading a CD-ROM disk 1122, or reading data from other high-capacity optical media, such as a DVD, or recording data in the high-capacity optical media). A hard disk drive 1114, a magnetic disk drive 1116, and an optical disk drive 1120 may be connected to a system bus 1108 by a hard disk drive interface 1124, a magnetic disk drive interface 1126, and an optical drive interface 1128, respectively. An interface 1124 for implementing an exterior mounted drive includes, for example, at least one of or both a universal serial bus (USB) and the Institute of Electrical and Electronics Engineers (IEEE) 1394 interface technology.

The drives and the computer readable media associated with the drives provide non-volatile storage of data, data structures, computer executable commands, and the like. In the case of the computer 1102, the drive and the medium correspond to the storage of random data in an appropriate digital form. In the description of the computer readable media, the HDD, the portable magnetic disk, and the portable optical media, such as a CD, or a DVD, are mentioned, but those skilled in the art will well appreciate that other types of computer readable media, such as a zip drive, a magnetic cassette, a flash memory card, and a cartridge, may also be used in the illustrative operation environment, and the predetermined medium may include computer executable commands for performing the methods of the present disclosure.

A plurality of program modules including an operation system 1130, one or more application programs 1132, other program modules 1134, and program data 1136 may be stored in the drive and the RAM 1112. An entirety or a part of the operation system, the application, the module, and/or data may also be cached in the RAM 1112. It will be well appreciated that the present disclosure may be implemented by several commercially usable operation systems or a combination of operation systems.

A user may input a command and information to the computer 1102 through one or more wired/wireless input devices, for example, a keyboard 1138 and a pointing device, such as a mouse 1140. Other input devices (not illustrated) may be a microphone, an IR remote controller, a joystick, a game pad, a stylus pen, a touch screen, and the like. The foregoing and other input devices are frequently connected to the processing device 1104 through an input device interface 1142 connected to the system bus 1108, but may be connected by other interfaces, such as a parallel port, an IEEE 1394 serial port, a game port, a USB port, an IR interface, and other interfaces.

A monitor 1144 or other types of display devices are also connected to the system bus 1108 through an interface, such as a video adaptor 1146. In addition to the monitor 1144, the computer generally includes other peripheral output devices (not illustrated), such as a speaker and a printer.

The computer 1102 may be operated in a networked environment by using a logical connection to one or more remote computers, such as remote computer(s) 1148, through wired and/or wireless communication. The remote computer(s) 1148 may be a work station, a computing device computer, a router, a personal computer, a portable computer, a microprocessor-based entertainment device, a peer device, and other general network nodes, and generally includes some or an entirety of the constituent elements described for the computer 1102, but only a memory storage device 1150 is illustrated for simplicity. The illustrated logical connection includes a wired/wireless connection to a local area network (LAN) 1152 and/or a larger network, for example, a wide area network (WAN) 1154. The LAN and WAN networking environments are general in an office and a company, and make an enterprise-wide computer network, such as an Intranet, easy, and all of the LAN and WAN networking environments may be connected to a worldwide computer network, for example, the Internet.

When the computer 1102 is used in the LAN networking environment, the computer 1102 is connected to the local network 1152 through a wired and/or wireless communication network interface or an adaptor 1156. The adaptor 1156 may make wired or wireless communication to the LAN 1152 easy, and the LAN 1152 also includes a wireless access point installed therein for the communication with the wireless adaptor 1156. When the computer 1102 is used in the WAN networking environment, the computer 1102 may include a modem 1158, is connected to a communication computing device on a WAN 1154, or includes other means setting communication through the WAN 1154 via the Internet. The modem 1158, which may be an embedded or outer-mounted and wired or wireless device, is connected to the system bus 1108 through a serial port interface 1142. In the networked environment, the program modules described for the computer 1102 or some of the program modules may be stored in a remote memory/storage device 1150. The illustrated network connection is illustrative, and those skilled in the art will appreciate well that other means setting a communication link between the computers may be used.

The computer 1102 performs an operation of communicating with a predetermined wireless device or entity, for example, a printer, a scanner, a desktop and/or portable computer, a portable data assistant (PDA), a communication satellite, predetermined equipment or place related to a wirelessly detectable tag, and a telephone, which is disposed by wireless communication and is operated. The operation includes a wireless fidelity (Wi-Fi) and Bluetooth wireless technology at least. Accordingly, the communication may have a pre-defined structure, such as a network in the related art, or may be simply ad hoc communication between at least two devices.

The Wi-Fi enables a connection to the Internet and the like even without a wire. The Wi-Fi is a wireless technology, such as a cellular phone, which enables the device, for example, the computer, to transmit and receive data indoors and outdoors, that is, in any place within a communication range of a base station. A Wi-Fi network uses a wireless technology, which is called IEEE 802.11 (a, b, g, etc.) for providing a safe, reliable, and high-rate wireless connection. The Wi-Fi may be used for connecting the computer to the computer, the Internet, and the wired network (IEEE 802.3 or Ethernet is used). The Wi-Fi network may be operated at, for example, a data rate of 11 Mbps (802.11a) or 54 Mbps (802.11b) in an unauthorized 2.4 and 5 GHz wireless band, or may be operated in a product including both bands (dual bands).

Those skilled in the art may appreciate that information and signals may be expressed by using predetermined various different technologies and techniques. For example, data, indications, commands, information, signals, bits, symbols, and chips referable in the foregoing description may be expressed with voltages, currents, electromagnetic waves, magnetic fields or particles, optical fields or particles, or a predetermined combination thereof.

Those skilled in the art will appreciate that the various illustrative logical blocks, modules, processors, means, circuits, and algorithm operations described in relationship to the exemplary embodiments disclosed herein may be implemented by electronic hardware (for convenience, called "software" herein), various forms of program or design code, or a combination thereof. In order to clearly describe compatibility of the hardware and the software, various illustrative components, blocks, modules, circuits, and operations are generally illustrated above in relation to the functions of the hardware and the software. Whether the function is implemented as hardware or software depends on design limits given to a specific application or an entire system. Those skilled in the art may perform the function described by various schemes for each specific application, but it shall not be construed that the determinations of the performance depart from the scope of the present disclosure.

Various exemplary embodiments presented herein may be implemented by a method, a device, or a manufactured article using a standard programming and/or engineering technology. A term "manufactured article" includes a computer program, a carrier, or a medium accessible from a predetermined computer-readable storage device. For example, the computer-readable storage medium includes a magnetic storage device (for example, a hard disk, a floppy disk, and a magnetic strip), an optical disk (for example, a CD and a DVD), a smart card, and a flash memory device (for example, an EEPROM, a card, a stick, and a key drive), but is not limited thereto. Further, various storage media presented herein include one or more devices and/or other machine-readable media for storing information.

It shall be understood that a specific order or a hierarchical structure of the operations included in the presented processes is an example of illustrative accesses. It shall be understood that a specific order or a hierarchical structure of the operations included in the processes may be rearranged within the scope of the present disclosure based on design priorities. The accompanying method claims provide various operations of elements in a sample order, but it does not mean that the claims are limited to the presented specific order or hierarchical structure.

The description of the presented exemplary embodiments is provided so as for those skilled in the art to use or carry out the present disclosure. Various modifications of the exemplary embodiments may be apparent to those skilled in the art, and general principles defined herein may be applied to other exemplary embodiments without departing from the scope of the present disclosure. Accordingly, the present disclosure is not limited to the exemplary embodiments suggested herein, and shall be interpreted within the broadest meaning range consistent to the principles and new characteristics presented herein.

What is claimed is:

1. A method for a logical CNOT operation of quantum logical qubits, which is performed by a quantum computing device, the method comprising:
    arranging a plurality of logical data qubits in a first horizontal column;
    arranging a plurality of logical ancilla qubits corresponding to the plurality of logical data qubits, respectively as a second horizontal column which is different from the first horizontal column to correspond to the plurality of logical data qubits, respectively; and
    performing logical controlled NOT (CNOT) for a first logical data qubit and a second logical data qubit among the plurality of logical data qubits,
    wherein each of the plurality of logical ancilla qubits includes an intermediate logical qubit.

2. The method of claim 1, wherein the first logical data qubit is a control qubit, and
    the second logical data qubit is a target qubit.

3. The method of claim 2, wherein the performing of the logical controlled NOT (CNOT) for the first logical data qubit and the second logical data qubit among the plurality of logical data qubits includes
    when there is no logical data qubit between the first logical data qubit and the second logical data qubit, merging the first logical data qubit and a first logical ancilla qubit corresponding to the first logical data qubit to generate a first merged qubit,
    merging the second logical data qubit and a second logical ancilla qubit corresponding to the second logical data qubit to generate a second merged qubit,
    splitting the first merged qubit into the first logical data qubit and the first logical ancilla qubit,
    merging the split first logical ancilla qubit and the second merged qubit to generate a third merged qubit, and
        splitting the third merged qubit into the second logical data qubit, the first logical ancilla qubit, and the second logical ancilla qubit, and not using the first logical ancilla qubit and the second logical ancilla qubit.

4. The method of claim 2, wherein the performing of the logical controlled NOT (CNOT) for the first logical data qubit and the second logical data qubit among the plurality of logical data qubits includes when there is at least a third logical data qubit between the first logical data qubit and the second logical data qubit, merging the first logical data qubit and a first logical ancilla qubit corresponding to the first logical data qubit to generate a fourth merged qubit,
    merging the second logical data qubit, a second logical ancilla qubit corresponding to the second logical data qubit, and at least a logical ancilla qubit corresponding to the at least third logical data qubit to generate a fifth combined qubit,
    splitting the fourth merged qubit into the first logical data qubit and the first logical ancilla qubit,
    merging the split first logical ancilla qubit and the fifth merged qubit to generate a sixth merged qubit, and
        splitting the sixth merged qubit into the second logical data qubit, the first logical ancilla qubit, the second logical ancilla qubit, and the at least third logical ancilla qubit, and not using the first logical ancilla qubit, the second logical ancilla qubit, and the at least third logical ancilla qubit.

5. A method for a logical CNOT operation of quantum logical qubits, which is performed by a quantum computing device, the method comprising:
    arranging a plurality of logical data qubits in a first horizontal column;
    arranging a plurality of logical ancilla qubits corresponding to the plurality of logical data qubits, respectively as a second horizontal column which is different from the first horizontal column to correspond to the plurality of logical data qubits, respectively; and
    performing logical controlled NOT (CNOT) for a first logical data qubit and a second logical data qubit among the plurality of logical data qubits, wherein the arranging of the plurality of logical data qubits in the first horizontal column includes arranging the plurality of logical data qubits in the first horizontal column based on the number of qubit operations related to a performing circuit.

6. The method of claim 5, wherein the arranging of the plurality of logical data qubits in the first horizontal column based on the number of qubit operations related to the performing circuit includes
    arranging a third logical data qubit determined as a first priority at a center of the first horizontal column based on the number of qubit operations,
    arranging a fourth logical data qubit determined as a second priority on the first horizontal column to correspond to one side of the third logical data qubit in the first horizontal column based on the number of qubit operations, and
    arranging a fifth logical data qubit determined as a third priority on the first horizontal column to correspond to the other side of the third logical data qubit in the first horizontal column according to the number of qubit operations.

7. The method of claim 6, further comprising:
    arranging a sixth logical data qubit determined as a fourth priority on the first horizontal column to correspond to one side of the fifth logical data qubit in the first horizontal column according to the number of qubit operations; and
    arranging a seventh logical data qubit determined as a fifth priority on the first horizontal column to correspond to one side of the fifth logical data qubit in the first horizontal column according to the number of qubit operations, wherein one side of the fourth logical data qubit in the first horizontal column is a portion of the first horizontal column that does not correspond to one side of the third logical data qubit, and one side of the fifth logical data qubit in the first horizontal column is a portion of the first horizontal column that does not correspond to the other side of the third logical data qubit in the first horizontal column.

8. The method of claim 1, further comprising:
when performing plurality of logical CNOTs, determining an order of operations of the plurality of logical CNOTs by using a routing algorithm including a scheduling function.

9. A method for a logical CNOT operation of quantum logical qubits, which is performed by a quantum computing device, the method comprising:
arranging a plurality of logical data qubits in a first horizontal column comprising at least one horizontal column including a predetermined number of logical data qubits;
arranging a plurality of logical ancilla qubits corresponding to the plurality of logical data qubits, respectively in a second horizontal column comprising at least one horizontal column, the second horizontal column is different from the first horizontal column;
arranging a plurality of additional logical ancilla qubits in at least one vertical column to correspond to the first horizontal column and at least one of a right end or a left end of the second horizontal column; and
performing logical controlled NOT (CNOT) for two logical data qubit in the vertical column among the plurality of logical data qubits.

* * * * *